(12) United States Patent
Tang

(10) Patent No.: US 10,147,898 B2
(45) Date of Patent: *Dec. 4, 2018

(54) ORGANIC LIGHT-EMITTING DEVICE AND DISPLAY DEVICE

(71) Applicant: Wuhan China Star Optoelectronics Technology Co., Ltd., Wuhan, Hubei (CN)

(72) Inventor: Jinming Tang, Guangdong (CN)

(73) Assignee: Wuhan China Star Optoelectronics Technology Co., Ltd, Wuhan, Hubei (CN)

(*) Notice: Subject to any disclaimer, the term of this patent is extended or adjusted under 35 U.S.C. 154(b) by 174 days.

This patent is subject to a terminal disclaimer.

(21) Appl. No.: 15/118,867

(22) PCT Filed: Jul. 20, 2016

(86) PCT No.: PCT/CN2016/090601
§ 371 (c)(1),
(2) Date: Aug. 13, 2016

(87) PCT Pub. No.: WO2017/219424
PCT Pub. Date: Dec. 28, 2017

(65) Prior Publication Data
US 2018/0166646 A1    Jun. 14, 2018

(30) Foreign Application Priority Data
Jun. 21, 2016 (CN) .......... 2016 1 0452465

(51) Int. Cl.
*H01L 51/50* (2006.01)
*H01L 51/00* (2006.01)
(Continued)

(52) U.S. Cl.
CPC .......... *H01L 51/5024* (2013.01); *C09K 11/06* (2013.01); *H01L 27/3244* (2013.01);
(Continued)

(58) Field of Classification Search
CPC .......... H01L 51/50; H01L 27/32; H01L 51/00; H01L 51/56; H01L 51/52
(Continued)

(56) References Cited

U.S. PATENT DOCUMENTS 8,795,852 B2  8/2014 Asari et al.
9,166,184 B2  10/2015 Yang
(Continued)

FOREIGN PATENT DOCUMENTS

CN  101867021 A  10/2010
CN  102983286 A  3/2013
(Continued)

OTHER PUBLICATIONS

Chen Hua, Design, Synthesis and Performance of Efficient Phosphorescent OLED Materials,Engineering Science first series in China Doctoral Dissertations Full-text Database,Sep. 15, 2014,paragraph 2 on p. 46 to last paragraph on p. 66,vol. 9, Suzhou China.

*Primary Examiner* — Sheikh Maruf
(74) *Attorney, Agent, or Firm* — Andrew C. Cheng

(57) ABSTRACT

An organic light-emitting device and a display device are disclosed. The organic light-emitting device includes a substrate layer, a first electrode layer, a light-emitting layer, a second electrode layer which are stacked; and a first barrier layer disposed between the first electrode layer and the light-emitting layer, a second barrier layer disposed between the second electrode layer and the light-emitting layer, wherein, each of the first and second barrier layers includes a light-emitting host material, a triplet energy level T1 of the light-emitting host material ≥2.5 ev. Because the organic (Continued)

light-emitting device is disposed with first and second barrier layers including the light-emitting host material, the structure of the light-emitting device can increase the lifetime and the luminous efficiency of the organic light-emitting device.

17 Claims, 2 Drawing Sheets

(51) Int. Cl.
  *H01L 51/52* (2006.01)
  *C09K 11/06* (2006.01)
  *H01L 27/32* (2006.01)
  *H01L 51/56* (2006.01)
(52) U.S. Cl.
  CPC ............ *H01L 51/001* (2013.01); *H01L 51/50* (2013.01); *H01L 51/5004* (2013.01); *H01L 51/5016* (2013.01); *H01L 51/5056* (2013.01); *H01L 51/5072* (2013.01); *H01L 51/5206* (2013.01); *H01L 51/5221* (2013.01); *H01L 51/56* (2013.01); *C09K 2211/1018* (2013.01); *C09K 2211/1029* (2013.01); *C09K 2211/185* (2013.01); *H01L 51/0052* (2013.01); *H01L 51/0054* (2013.01); *H01L 51/0067* (2013.01); *H01L 51/0072* (2013.01); *H01L 51/0074* (2013.01); *H01L 51/0085* (2013.01); *H01L 2251/5384* (2013.01); *H01L 2251/552* (2013.01); *H01L 2251/558* (2013.01)
(58) Field of Classification Search
  USPC ........................................ 257/40; 438/82, 99
  See application file for complete search history.

(56) References Cited

U.S. PATENT DOCUMENTS

| | | | | |
|---|---|---|---|---|
| 2002/0021088 | A1* | 2/2002 | Howard | H01L 51/5215 313/504 |
| 2003/0048072 | A1* | 3/2003 | Ishihara | H01L 51/5262 313/506 |
| 2004/0214041 | A1* | 10/2004 | Lu | B82Y 10/00 428/690 |
| 2007/0231503 | A1* | 10/2007 | Hwang | C09K 11/06 428/1.1 |
| 2008/0107919 | A1* | 5/2008 | Hwang | C07D 209/88 428/691 |
| 2008/0113216 | A1* | 5/2008 | Inoue | C07F 15/0086 428/690 |
| 2008/0286606 | A1* | 11/2008 | Hwang | C09K 11/06 428/690 |
| 2009/0200928 | A1* | 8/2009 | Hwang | C09K 11/06 313/504 |
| 2009/0226757 | A1* | 9/2009 | Song | H01L 51/5036 428/690 |
| 2010/0006830 | A1* | 1/2010 | Hong | C07D 495/04 257/40 |
| 2011/0168988 | A1* | 7/2011 | Jeong | H01L 27/3211 257/40 |
| 2011/0215301 | A1* | 9/2011 | Forrest | H01L 51/5036 257/40 |
| 2012/0001158 | A1* | 1/2012 | Asari | C07D 487/04 257/40 |
| 2014/0054570 | A1* | 2/2014 | Yang | H01L 51/5004 257/40 |
| 2015/0001506 | A1* | 1/2015 | Kim | H01L 51/5278 257/40 |
| 2015/0060791 | A1* | 3/2015 | Shin | H01L 51/0067 257/40 |
| 2015/0155515 | A1* | 6/2015 | Kim | H01L 51/5008 257/40 |

FOREIGN PATENT DOCUMENTS

| | | |
|---|---|---|
| CN | 103227294 A | 7/2013 |
| CN | 103762317 A | 4/2014 |
| CN | 105870350 A | 8/2016 |
| JP | 2003133075 A | 5/2003 |

* cited by examiner

ORGANIC LIGHT-EMITTING DEVICE AND DISPLAY DEVICE

BACKGROUND OF THE INVENTION

1. Field of the Invention

The present invention relates to a display technology field, and more particularly to an organic light-emitting device and a display device.

2. Description of Related Art

Because the AMOLED (abbreviation of active-matrix organic light emitting diode) display panel has advantages of self-luminous, simple structure, low cost, fast response, wide viewing angle, color saturation, high contrast, thin, etc. comparing to an LCD panel so that more and more smartphones and wearable devices begin to adopt the AMOLED panel.

Along with the large-scale application, more and higher requirements for the performance of the AMOLED are proposed such as low voltage, high brightness, high efficiency, low power consumption, long lifetime, etc.

SUMMARY OF THE INVENTION

The present invention provides an organic light-emitting device and a display device in order to solve the technology problems of short lifetime and low efficiency of the AMOLED device in the conventional art.

In order to solve the above technology problem, one technology solution adopted by the present invention is: providing an organic light-emitting device, comprising:

a substrate layer, a first electrode layer, a light-emitting layer, and a second electrode layer which are stacked;

a first barrier layer disposed between the first electrode layer and the light-emitting layer, a second barrier layer disposed between the second electrode layer and the light-emitting layer, wherein each of the first barrier layer and the second barrier layer includes a light-emitting host material, a triplet energy level T1 of the light-emitting host material ≥2.5 ev;

wherein, the first electrode layer and the second electrode layer are respectively an anode layer and a cathode layer;

wherein, the light-emitting host material of the first barrier layer is a hole-type host material, the energy level of the highest occupied molecular orbit and the energy level of the lowest unoccupied molecular orbit are respectively 5.3~5.7 ev and 1.8~2.3 ev;

wherein, the light-emitting host material of the second barrier layer is an ambipolar light-emitting host material, the energy level of the highest occupied molecular orbit and the energy level of the lowest unoccupied molecular orbit are respectively 5.5~6.0 ev and 2.5~3.5 ev; and wherein, the light-emitting layer is made of a first light-emitting host material, a second light-emitting host material and a phosphorescent dopant, and the first barrier layer is made of the second light-emitting host material, and the second barrier layer is made of the first light-emitting host material.

Another technology solution adopted by the present invention is: providing an organic light-emitting device, comprising:

a substrate layer, a first electrode layer, a light-emitting layer, and a second electrode layer which are stacked;

a first barrier layer disposed between the first electrode layer and the light-emitting layer, a second barrier layer disposed between the second electrode layer and the light-emitting layer, wherein each of the first barrier layer and the second barrier layer includes a light-emitting host material, a triplet energy level T1 of the light-emitting host material ≥2.5 ev.

According to an embodiment of the present invention, the first electrode layer and the second electrode layer are respectively an anode layer and a cathode layer;

the light-emitting host material of the first barrier layer is a hole-type host material, the energy level of the highest occupied molecular orbit and the energy level of the lowest unoccupied molecular orbit are respectively 5.3~5.7 ev and 1.8~2.3 ev; and the light-emitting host material of the second barrier layer is an ambipolar light-emitting host material, the energy level of the highest occupied molecular orbit and the energy level of the lowest unoccupied molecular orbit are respectively 5.5~6.0 ev and 2.5~3.5 ev.

According to an embodiment of the present invention, the organic light-emitting device further includes a hole transporting layer disposed between the first barrier layer and the anode layer, and an electron transporting layer disposed between the second barrier layer and the cathode layer;

a difference of energy level of highest occupied molecular orbit of the first barrier layer and the hole transporting layer is less than 0.2 ev, a difference of energy level of lowest unoccupied molecular orbit of the first barrier layer and the hole transporting layer is greater than 0.2 ev; and a difference of energy level of lowest unoccupied molecular orbit of the second barrier layer and the electron transporting layer is less than 0.2 ev, a difference of energy level of highest occupied molecular orbit of the second barrier layer and the electron transporting layer is greater than 0.2 ev.

According to an embodiment of the present invention, the light-emitting layer is made of a first light-emitting host material, a second light-emitting host material and a phosphorescent dopant, and the first barrier layer is made of the second light-emitting host material, and the second barrier layer is made of the first light-emitting host material.

According to an embodiment of the present invention, the chemical structural formula of the first light-emitting host material is:

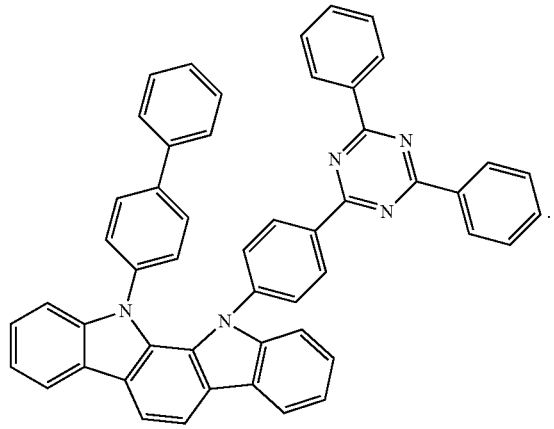 [SMILES: c1ccc(-c2ccc(-n3c4ccccc4c4ccc5c6ccccc6n(-c6ccc(-c7nc(-c8ccccc8)nc(-c8ccccc8)n7)cc6)c5c43)cc2)cc1]

According to an embodiment of the present invention, the chemical structural formula of the second light-emitting host material is:

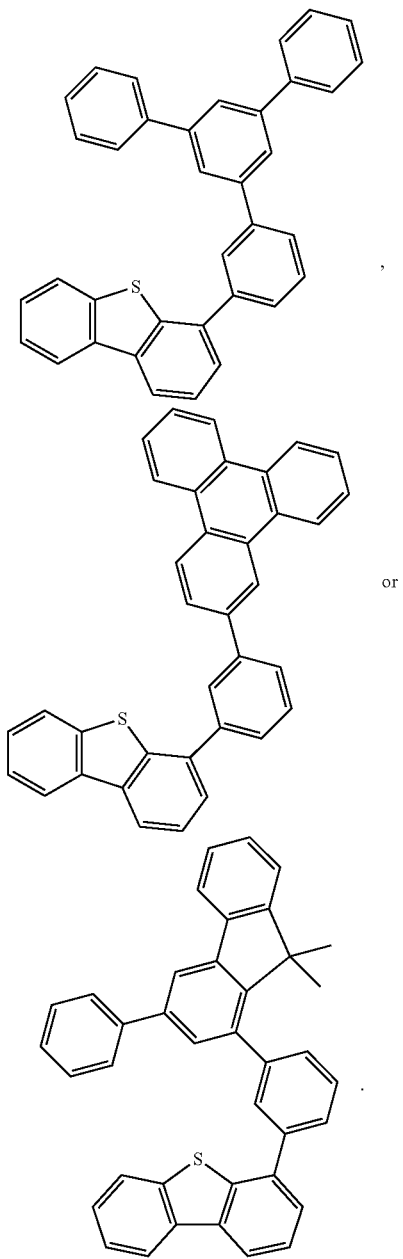

or

According to an embodiment of the present invention, a ratio of film thicknesses of the first light-emitting host material, the second light-emitting host material and the phosphorescent dopant is 5:5:1.

According to an embodiment of the present invention, a thickness of the first barrier layer is in a range of 1 nm~100 nm, and a thickness of the second barrier layer is in a range of 1 nm~50 nm.

According to an embodiment of the present invention, the thickness of the first barrier layer is in a range of 5 nm~50 nm, and a thickness of the second barrier layer is in a range of 5 nm~20 nm.

According to an embodiment of the present invention, the thickness of the first barrier layer is in a range of 10 nm~20 nm, and a thickness of the second barrier layer is in a range of 5 nm~10 nm.

According to an embodiment of the present invention, a thickness of the light-emitting layer is in a range of 10 nm~50 nm.

According to an embodiment of the present invention, a thickness of the hole transporting layer is in a range of 10 nm~30 nm.

According to an embodiment of the present invention, wherein, a thickness of the electron transporting layer is in a range of 10 nm~30 nm.

Another technology solution adopted by the present invention is: providing a display device comprising the organic light-emitting device described above.

The beneficial effects of the present invention is: comparing to the conventional art, the organic light-emitting device provided by the present invention, because the first barrier layer and the second barrier layer including the light-emitting host material is provided, and the light-emitting host material has a very high triplet energy level T1, when the light-emitting host material is used as the first barrier layer, the diffusion of the triplet exciton can be blocked in order to reduce the exciton quenching and increase the lifetime of the organic light-emitting device. Besides, when the light-emitting host material is used as the second barrier layer, the second barrier layer can effectively limit electrons and excitons at the light-emitting layer such that the electrons and holes are recombined in order to decrease the energy loss, increase the luminous efficiency of the organic light-emitting device.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures. In the figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
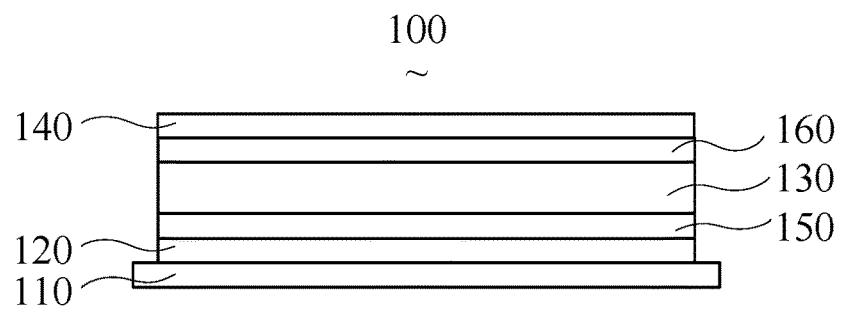
FIG. 1 is a schematic diagram of an organic light-emitting device of a first embodiment of the present invention.

With reference to FIG. 1, and FIG. 1 is a schematic diagram of an organic light-emitting device of a first embodiment of the present invention.

As shown in FIG. 1, the organic light-emitting device 100 includes a substrate layer 110, a first electrode layer 120, a light-emitting layer 130, and a second electrode layer 140 which are stacked. Besides, the organic light-emitting device 100 further includes a first barrier layer 150 disposed between the first electrode layer 120 and the light-emitting layer 130, and a second barrier layer 160 disposed between the second electrode layer 140 and the light-emitting layer 130. Each of the first barrier layer 150 and the second barrier layer 160 includes a light-emitting host material. A triplet energy level T1 of the light-emitting host material ≥2.5 ev. Wherein, the triplet energy level T1 can maximally reach 3.0 ev or above. Wherein, in a specific application example, the triplet energy level T1 can be 2.8 ev.

The organic light-emitting device 100 provided by the present invention, because the first barrier layer 150 and the second barrier layer 160 including the light-emitting host materials are provided, and each of the light-emitting host materials has a very high triplet energy level T1, when the light-emitting host material is used as the first barrier layer 150, the diffusion of the triplet exciton can be blocked in order to reduce the exciton quenching and increase the lifetime of the organic light-emitting device. Besides, when the light-emitting host material is used as the second barrier layer 160, the second barrier layer 160 can effectively limit electrons and excitons at the light-emitting layer such that the electrons and holes are recombined in order to decrease the energy loss, increase the luminous efficiency of the organic light-emitting device 100.

In a more specific embodiment, the first electrode layer 120 and the second electrode layer 140 are respectively an anode layer and a cathode layer. The light-emitting host material of the first barrier layer 150 is a hole-type host material, the energy level of the highest occupied molecular orbit (HOMO) and the energy level of the lowest unoccupied molecular orbit (LUMO) are respectively 5.3~5.7 ev and 1.8~2.3 ev; the light-emitting host material of the second barrier layer 160 is an ambipolar light-emitting host material, the energy level of the highest occupied molecular orbit (HOMO) and the energy level of the lowest unoccupied molecular orbit (LUMO) are respectively 5.5~6.0 ev and 2.5~3.5 ev.

The substrate layer 110 is a transparent substrate, a glass substrate or a flexible substrate. Wherein, the flexible substrate is made of one or multiple materials of polyester compound and polyimide-based compound.

The anode layer 120 can adopt an inorganic material or an organic conductive polymer. Wherein, the inorganic material is metal or metal oxide. The metal is a metal having a higher work function including gold, copper, silver, etc. The metal oxide specifically is indium tin oxide (ITO), zinc oxide, zinc tin oxide, etc. The conductive polymer is one material of polythiophene, polyvinyl benzene sulfonate, and polyaniline.

The cathode layer 140 can adopt metal or metal alloy. Wherein, the metal is a metal that has a lower work function including lithium, magnesium, calcium, strontium, aluminum, zinc, etc. The metal alloy is a metal alloy that has a lower work function or an alloy of the metal alloy and gold, silver or copper. In another embodiment, a cathode layer adopting a metal and a metal fluoride disposed alternatively can be provided. For example, the cathode layer is formed by lithium fluoride, metal silver, lithium fluoride and metal aluminum.

A thickness of the first barrier layer 150 is in a range of 1 nm~100 nm, and a thickness of the second barrier layer 160 is in a range of 1 nm~50 nm.

Further, the thickness of the first barrier layer 150 is in a range of 5 nm~50 nm, and a thickness of the second barrier layer 160 is in a range of 5 nm~20 nm.

Furthermore, the thickness of the first barrier layer 150 is in a range of 10 nm~20 nm, and the thickness of the second barrier layer 160 is in a range of 5 nm-10 nm.

The light-emitting layer 130 is made of a first light-emitting host material, a second light-emitting host material and a phosphorescent dopant. The first barrier layer 150 is made of the second light-emitting host material, and the second barrier layer 160 is made of the first light-emitting host material.

A ratio of film thicknesses of the first light-emitting host material, the second light-emitting host material and the phosphorescent dopant is 5:5:1.

The chemical structural formula of the first light-emitting host material HOST1 is:

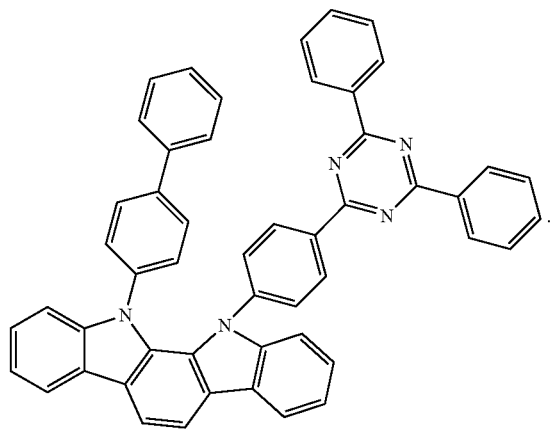 [SMILES: c1ccc(-c2ccc(-n3c4ccccc4c4ccc5c6ccccc6n(-c6ccc(-c7nc(-c8ccccc8)nc(-c8ccccc8)n7)cc6)c5c43)cc2)cc1]

The chemical structural formula of the second light-emitting host material HOST2 is:

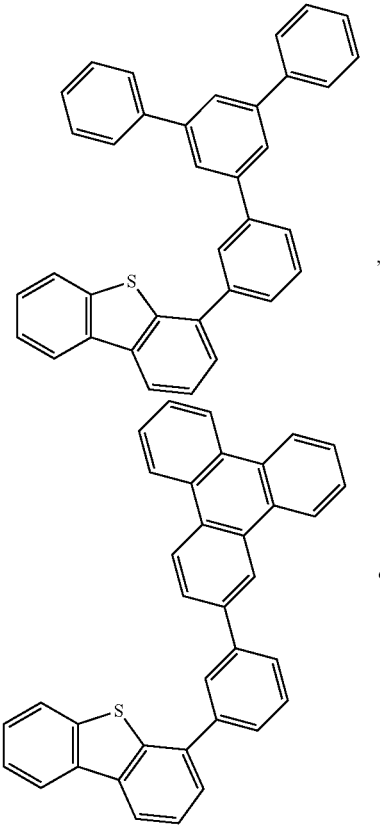

or

-continued

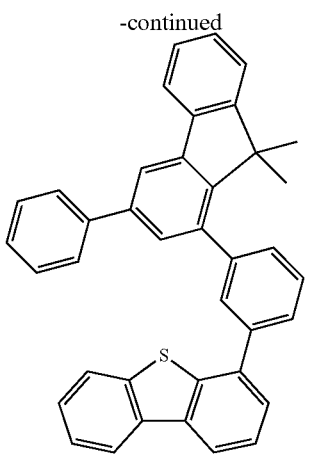

wherein, the names are respectively Co-host1, Co-host2 and Co-host3.

The phosphorescent dopant is a green phosphorescent dopant Dopan1, and the chemical structural formula of the Dopant1 is:

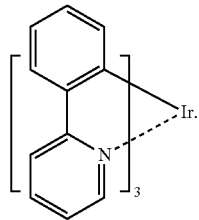

(1) APPLICATION EXAMPLE 1

In the present application example, the light-emitting layer 130 of the organic light-emitting device 100 is made of a first light-emitting host material HOST1, a second light-emitting material Co-host1 and the phosphorescent dopant Dopant1. Wherein, a ratio of film thicknesses of the first light-emitting host material HOST1, the second light-emitting host material Co-host1 and the phosphorescent dopant Dopant1 in the light-emitting layer 130 is 5:5:1. The first barrier layer 150 is made of the second light-emitting host material Co-host1, and the second barrier layer 160 is made of the first light-emitting host material HOST1.

(2) APPLICATION EXAMPLE 2

The structure of the organic light-emitting device in the present application example is the same as the application example 1, the difference is, the second light-emitting host material is Co-host2.

(3) APPLICATION EXAMPLE 3

The structure of the organic light-emitting device in the present application example is the same as the application example 1, the difference is, the second light-emitting host material is Co-host3.

In another application example, the first barrier layer 150 without the second light-emitting host material and the second barrier layer 160 without the first light-emitting host material can be adopted.

Parameters of the energy level and the mobility of the first light-emitting host material and the second light-emitting host material are shown in Table. 1

TABLE1 parameters of the energy level and the mobility of the first light-emitting host material and the second light-emitting host material

| Material | HOMO/ ev | LUMO/ ev | S1/ev | T1/ev | Hole mobility cm2/Vs | Electron mobility cm2/Vs |
|---|---|---|---|---|---|---|
| HOST1 | −5.9 | −2.7 | 3.2 | 2.8 | 3 * 10−5 | 7.1 * 10−5 |
| Co-host1 | −5.5 | −2.3 | 3.2 | 2.7 | 2.4 * 10−4 | 1.3 * 10−7 |
| Co-host2 | −5.4 | −2.0 | 3.4 | 2.4 | 4.4 * 10−4 | 2.3 * 10−7 |
| Co-host3 | −5.6 | −2.1 | 3.5 | 2.5 | 2.8 * 10−4 | 1.8 * 10−7 |

Wherein, HOMO (abbreviation of Highest Occupied Molecular Orbital) is the highest occupied molecular orbit, LUMO (abbreviation of Lowest Unoccupied Molecular Orbital) is the lowest unoccupied molecular orbit. Singlet energy level S1 is a difference value of the energy level of the lowest unoccupied molecular orbit (LUMO) and the energy level of the highest occupied molecular orbit (HOMO).

From the data shown in the Table. 1 the first light-emitting host material HOST1 has a good ambipolar property which is beneficial to the injection and recombination of the electron and the hole such that a recombination area of the exciton is wide so as to improve the lifetime of the organic light-emitting device. Besides, the second light-emitting host material Co-host1, Co-host2 or Co-host3 has a very good hole mobility and a very good energy level of the lowest unoccupied molecular orbit (LUMO), which can effectively block the electrons. Besides, the second light-emitting host material has a very high triplet energy level T1 so as to effectively block the excitons in order to effectively limit electrons and excitons at the light-emitting layer such that the electrons and holes are recombined in order to decrease the energy loss, increase the luminous efficiency of the organic light-emitting device.

Figure 2:
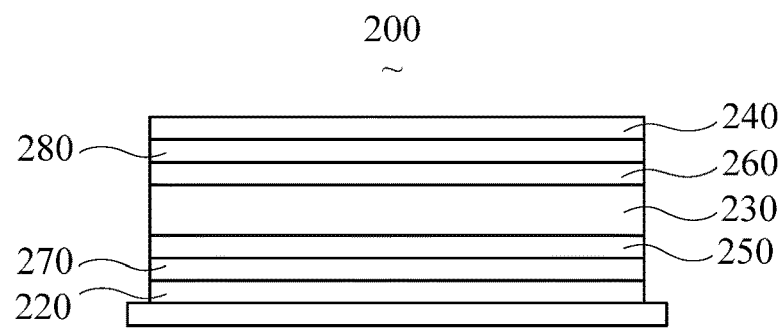
FIG. 2 is a schematic diagram of an organic light-emitting device of a second embodiment of the present invention.

With reference to FIG. 2, and FIG. 2 is a schematic diagram of an organic light-emitting device of a second embodiment of the present invention.

As shown in FIG. 2, an organic light-emitting device 200 further includes a hole transporting layer 270 disposed between a first barrier layer 250 and an anode layer 220, an electron transporting layer 280 disposed between a second barrier layer 260 and a cathode layer 240; a difference of energy level of highest occupied molecular orbit (HOMO) of the first barrier layer 250 and the hole transporting layer 270 is less than 0.2 ev, a difference of energy level of lowest unoccupied molecular orbit (LUMO) of the first barrier layer 250 and the hole transporting layer 270 is greater than 0.2 ev; a difference of energy level of lowest unoccupied molecular orbit (LUMO) of the second barrier layer 260 and the electron transporting layer 280 is less than 0.2 ev, a difference of energy level of highest occupied molecular orbit (HOMO) of the second barrier layer 260 and the electron transporting layer 280 is greater than 0.2 ev.

In the organic light-emitting device of the present invention, the substrate layer, the anode layer, the light-emitting layer, the cathode layer and the barrier layer are necessary layers, however, except the necessary layers, a hole injecting and transporting layer and an electron injecting and transporting layer can be provided. Wherein, the hole injecting and transporting layer means anyone or both of a hole injecting layer and a hole transporting layer, and the electron injecting and transporting layer means anyone or both of the electron injecting layer or the electron transporting layer.

Figure 3:
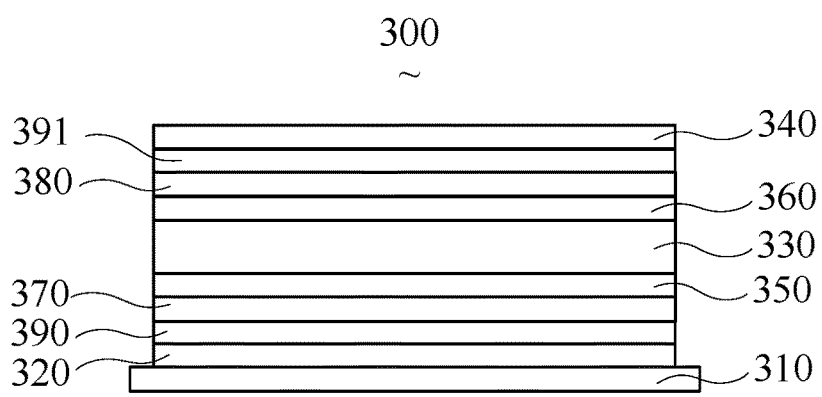
FIG. 3 is a schematic diagram of an organic light-emitting device of a third embodiment of the present invention.

With reference to FIG. 3, and FIG. 3 is a schematic diagram of an organic light-emitting device of a third embodiment of the present invention.

As shown in FIG. 3, the organic light-emitting device 300 further includes a hole injecting layer 390 and an electron injecting layer 391, and the structure of the organic light-emitting device of the following embodiments can refer to the above.

Specifically, the organic light-emitting device 300 includes a substrate layer 310, an anode layer 320, a hole injecting layer 390, a hole transporting layer 370, a first barrier layer 350, a light-emitting layer 330, a second barrier layer 360, an electron transporting layer 380, an electron injecting layer 391 and a cathode layer 340.

(4) APPLICATION EXAMPLE 4

The substrate layer 310 adopts a glass substrate, the anode layer 320 adopts indium tin oxide (ITO), the hole injecting layer 390 adopts a material of HAT(CN)$_6$, the hole transporting layer 370 adopts a material of HTM081 manufactured by the Merck company, the first barrier layer 350 adopts the second light-emitting host material Co-host1, the light-emitting layer 330 adopts the first light-emitting host material HOST1, the second light-emitting host material Co-host1 and the phosphorescent dopant Dopant1, the second barrier layer 360 adopts the first light-emitting host material HOST1, the electron transporting layer 380 adopts a material of BPhen, the electron injecting layer 391 adopts lithium fluoride (LiF), and the cathode layer 340 adopts aluminum.

Wherein, the chemical structural formula of HAT(CN)$_6$ is

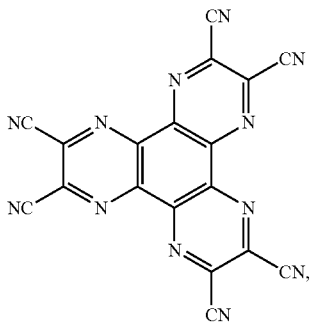 [SMILES: N#Cc1nc2c3nc(C#N)c(C#N)nc3c3nc(C#N)c(C#N)nc3c2nc1C#N]

the specific composition of HTM081 is a trade secret of the Merck company. The chemical structural formula of BPhen is

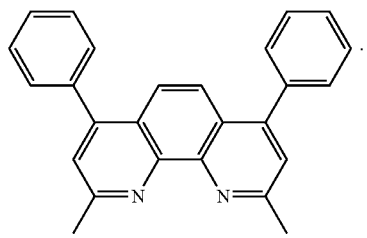 [SMILES: Cc1cc(-c2ccccc2)c2ccc3c(-c4ccccc4)cc(C)nc3c2n1]

The main manufacturing method for the organic light-emitting device 300 is the evaporation method, and the manufacturing process comprises:

Step 1: Cleaning the Substrate Layer 310 and the Anode Layer 320

Performing an ultrasonic cleaning to the glass substrate 310 coated with ITO in a detergent. Then, washing in the deionized water. Performing an ultrasonic cleaning in a mixed solvent of a volume ratio of acetone to ethanol being 1:1. Baking in a clean environment, wherein, a baking temperature is in a range of 130° C.~220° C. and a time period is from one hour to two hours. Cleaning by using ultraviolet light and ozone. Then, using a low energy cation beam to bombard a surface of the ITO such that the ITO of the glass substrate 310 forms the anode layer 320.

Step 2: Evaporating Other Layers

Placing the glass substrate 310 coated with ITO in a vacuum chamber. Evacuating to $1\times10^{-6}$ Pa~$2\times10^{-4}$ Pa. On an anode surface of the ITO, evaporating HAT(CN)$_6$ as a hole injecting layer 390. Wherein, an evaporation rate is in a range of 0.01 nm/s~0.1 nm/s, an evaporation thickness is in a range of 1 nm~10 nm. In the present application example, the evaporation rate adopts 0.05 nm/s and the evaporation thickness adopts 5 nm.

Evaporating HTM081 on a surface of the hole injecting layer 390 as a hole transporting layer 370. Wherein, the evaporation rate is in a range of 0.01 nm/s~0.2 nm/s, an evaporation thickness is in a range of 10 nm~30 nm. In the present application example, the evaporation rate adopts 0.1 nm/s and the evaporation thickness adopts 20 nm.

Evaporating the second light-emitting host material Co-host1 on a surface of the hole transporting layer 390 as the first barrier layer 350, wherein, the evaporation rate is in a range of 0.01 nm/s~0.2 nm/s, an evaporation thickness is in a range of 5 nm~20 nm. In the present application example, the evaporation rate adopts 0.1 nm/s and the evaporation thickness adopts 10 nm.

Evaporating the first light-emitting host material HOST1, the second light-emitting host material Co-host1 and the phosphorescent dopant Dopant1 as the light-emitting layer 330. Wherein, a ratio of film thicknesses of the first light-emitting host material HOST1, the second light-emitting host material Co-host1 and the phosphorescent dopant Dopant1 is 5:5:1. A tri-source co-evaporation method is adopted to evaporate the first light-emitting host material HOST1, the second light-emitting host material Co-host1 and the phosphorescent dopant Dopant1. Wherein, an evaporation rate of the first light-emitting host material HOST1 is in a range of 0.05 nm/s~0.5 nm/s, an evaporation rate of the second light-emitting host material Co-host1 is in a range of 0.05 nm/s~0.5 nm/s, an evaporation rate of the phosphorescent dopant Dopant1 is in a range of 0.005 nm/s~0.05 nm/s. A total evaporation thickness is in a range of 10 nm~50 nm. The thicknesses of the materials are proportionally distributed according to the evaporation rates. In the present application, the evaporation rate of the first light-emitting host material HOST1 adopts 0.1 nm/s, the evaporation rate of the second light-emitting host material Co-host1 adopts 0.1 nm/s, the evaporation rate of the phosphorescent dopant Dopant1 adopts 0.02 nm/s and the total evaporation thickness adopts 30 nm.

Evaporating the first light-emitting host material HOST1 on a surface of the light-emitting layer 330 as the second barrier layer 360, wherein, the evaporation rate is in a range of 0.01 nm/s~0.2 nm/s, an evaporation thickness is in a range of 1 nm-10 nm. In the present application example, the evaporation rate adopts 0.1 nm/s and the evaporation thickness adopts 5 nm.

Evaporating Bphen on a surface of the second barrier layer 360 as an electron transporting layer 380. Wherein, the evaporation rate is in a range of 0.01 nm/s~0.2 nm/s, an evaporation thickness is in a range of 10 nm~30 nm. In the present application example, the evaporation rate adopts 0.1 nm/s and the evaporation thickness adopts 20 nm.

Evaporating lithium fluoride on a surface of the electron transporting layer 380 as an electron injecting layer 391. Wherein, the evaporation rate is in a range of 0.005 nm/s~0.1 nm/s, an evaporation thickness is in a range of 0.1 nm~5 nm. In the present application example, the evaporation rate adopts 0.01 nm/s and the evaporation thickness adopts 0.5 nm.

Evaporating aluminum on a surface of the electron injecting layer 391 as a cathode layer 340. Wherein, the evaporation rate is in a range of 0.005 nm/s~0.5 nm/s, an evaporation thickness is in a range of 100 nm~200 nm. In the present application example, the evaporation rate adopts 0.1 nm/s and the evaporation thickness adopts 150 nm. The thickness of the cathode layer 340 is far greater than the thickness of the other layers because the cathode layer 340 is required to reach a total reflection condition.

The evaporation process of the above layers can be at different vacuum chambers, each vacuum chamber is evacuated to $1 \times 10^{-6}$ Pa to $2 \times 10^{-4}$ Pa.

(5) APPLICATION EXAMPLE 5

The evaporation rate and thickness of the present application example is the same as the application example 4, the difference is, the second light-emitting host material Co-host1 of the first barrier layer 350 and the light-emitting layer 330 is replaced as the second light-emitting host material Co-host2.

(6) APPLICATION EXAMPLE 6

The evaporation rate and thickness of the present application example is the same as the application example 4, the difference is, the second light-emitting host material Co-host1 of the first barrier layer 350 and the light-emitting layer 330 is replaced as the second light-emitting host material Co-host3.

(7) COMPARISON EXAMPLE 1

The evaporation rate and thickness of the present application example is the same as the application example 4, the difference is, the first barrier layer 350 made of the second light-emitting host material Co-host 1 and the second barrier layer 360 made of the first light-emitting host material HOST1 is not adopted.

Performance parameters of the organic light-emitting device 300 obtained in each application example and the comparison example are shown as Table. 2

TABLE 2

| performance parameters of the organic light-emitting device | | | | | |
|---|---|---|---|---|---|
| Device | Brightness cd/m² | Voltage V | Current efficiency cd/A | Color coordinates (x, y) | Lifetime LT90 |
| Comparison example 1 | 5000 | 4.0 | 45.6 | (0.32, 0.61) | 200 |
| Application example 4 | 5000 | 3.8 | 54.7 | (0.32, 0.61) | 400 |
| Application example 5 | 5000 | 3.8 | 55.9 | (0.32, 0.61) | 430 |

TABLE 2-continued

| performance parameters of the organic light-emitting device | | | | | |
|---|---|---|---|---|---|
| Device | Brightness cd/m² | Voltage V | Current efficiency cd/A | Color coordinates (x, y) | Lifetime LT90 |
| Application example 6 | 5000 | 3.9 | 56.2 | (0.32, 0.61) | 445 |

From the data shown in Table. 2, using the color coordinates (0.32, 0.61) as a reference, comparing among the application example 4, the application example 5, the application example 6 and the comparison example 1 (without the first barrier layer 350 and the second barrier layer 360), the voltage and the current efficiency are basically the same, and the lifetime of the organic light-emitting device 300 is extended to be double. The reason is that each of the first light-emitting host material and the second light-emitting host material has a very high triplet energy level T1, when the first light-emitting host material and the second light-emitting host material are used as the materials of the barrier layers, the diffusion of the triplet exciton can be blocked in order to reduce the exciton quenching and increase the lifetime of the organic light-emitting device 300. Besides, the present invention can effectively limit electrons and excitons at the light-emitting layer such that the electrons and holes are recombined in order to decrease the energy loss, increase the luminous efficiency of the organic light-emitting device 300.

Figure 4:
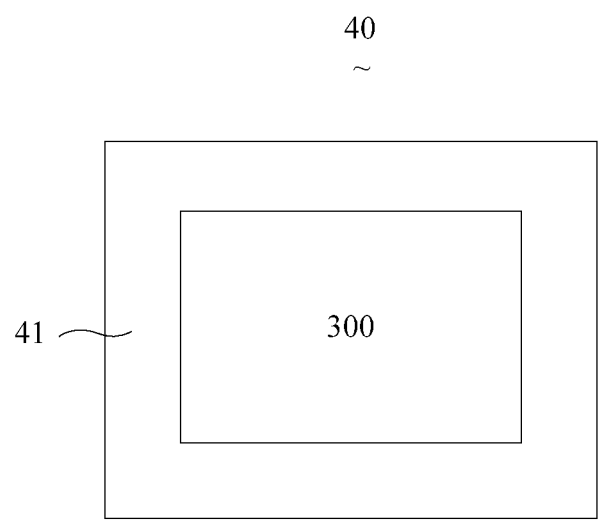
FIG. 4 is a schematic diagram of a display device of an embodiment of the present invention.

With reference to FIG. 4, and FIG. 4 is a schematic diagram of a display device of an embodiment of the present invention.

As shown in FIG. 4, the display device 40 includes a substrate 41 and the organic light-emitting device 300 described above. Wherein, the organic light-emitting device 300 is disposed on the substrate 41.

Wherein, the structure of the organic light-emitting device 300 can refer to the content of the above, no more repeating.

In summary, the person skilled in the art can easily understood, because the organic light-emitting device provided by the present invention is disposed with the first barrier layer and the second barrier layer including the light-emitting host material, the light-emitting host material has a very high triplet energy level T1. When the light-emitting host material is used as the first barrier layer, the diffusion of the triplet exciton can be blocked in order to reduce the exciton quenching and increase the lifetime of the organic light-emitting device, and when the light-emitting host material is used as the second barrier layer, the second barrier layer can effectively limit electrons and excitons at the light-emitting layer such that the electrons and holes are recombined in order to decrease the energy loss, increase the luminous efficiency of the organic light-emitting device.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An organic light-emitting device, comprising:

a substrate layer, a first electrode layer, a light-emitting layer, and a second electrode layer which are stacked;

a first barrier layer disposed between the first electrode layer and the light-emitting layer, a second barrier layer disposed between the second electrode layer and the light-emitting layer, wherein each of the first barrier layer and the second barrier layer includes a light-emitting host material, a triplet energy level T1 of the light-emitting host material ≥2.5 ev;

wherein, the light-emitting layer is made of a first light-emitting host material having a first film thickness, a second light-emitting host material having a second film thickness and a phosphorescent dopant having a third film thickness which are stacked in a layer by layer way, and the first barrier layer is made of the second light-emitting host material, and the second barrier layer is made of the first light-emitting host material;

wherein the first light-emitting host material having the first film thickness is adjacent to the first barrier layer; and wherein the phosphorescent dopant having a third film thickness is adjacent to the second barrier layer.

2. The device according to claim 1, wherein, the first electrode layer and the second electrode layer are respectively an anode layer and a cathode layer;

the light-emitting host material of the first barrier layer is a hole-type host material, the energy level of the highest occupied molecular orbit and the energy level of the lowest unoccupied molecular orbit are respectively 5.3~5.7 ev and 1.8~2.3 ev; and the light-emitting host material of the second barrier layer is an ambipolar light-emitting host material, the energy level of the highest occupied molecular orbit and the energy level of the lowest unoccupied molecular orbit are respectively 5.5~6.0 ev and 2.5~3.5 ev.

3. The device according to claim 2, wherein, the organic light-emitting device further includes a hole transporting layer disposed between the first barrier layer and the anode layer, and an electron transporting layer disposed between the second barrier layer and the cathode layer;

a difference of energy level of highest occupied molecular orbit of the first barrier layer and the hole transporting layer is less than 0.2 ev, a difference of energy level of lowest unoccupied molecular orbit of the first barrier layer and the hole transporting layer is greater than 0.2 ev; and a difference of energy level of lowest unoccupied molecular orbit of the second barrier layer and the electron transporting layer is less than 0.2 ev, a difference of energy level of highest occupied molecular orbit of the second barrier layer and the electron transporting layer is greater than 0.2 ev;

wherein a material of the first barrier layer and a material of the hole transporting layer are different; and wherein a material of the second barrier layer and a material of the electron transporting layer are different.

4. The device according to claim 1 wherein, the chemical structural formula of the first light-emitting host material is:

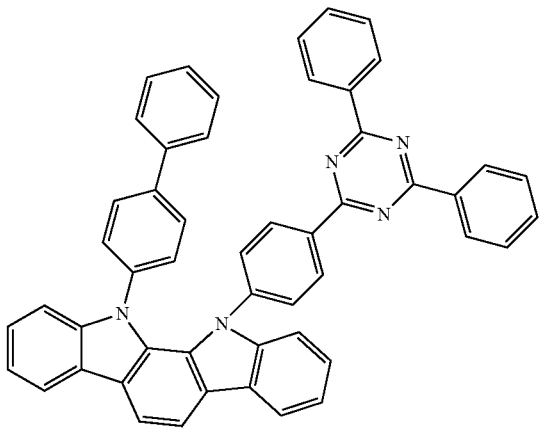

5. The device according to claim 1, wherein, the chemical structural formula of the second light-emitting host material is:

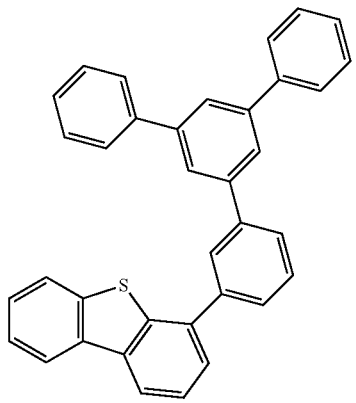

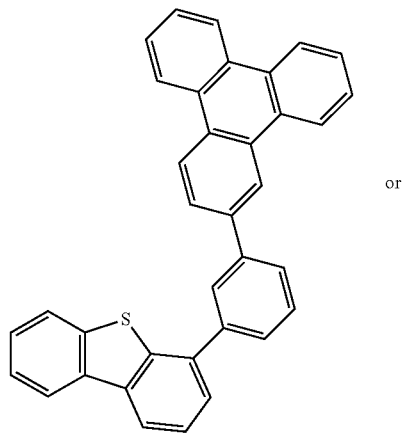

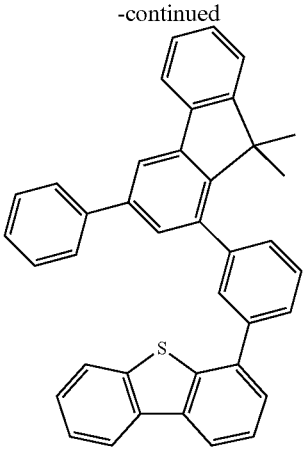

6. The device according to claim 1, wherein, a ratio of the first, second and third film thicknesses of the first light-emitting host material, the second light-emitting host material and the phosphorescent dopant is 5:5:1.

7. The device according to claim 1, wherein, a thickness of the first barrier layer is in a range of 1 nm~100 nm, and a thickness of the second barrier layer is in a range of 1 nm~50 nm.

8. The device according to claim 7, wherein, the thickness of the first barrier layer is in a range of 5 nm~50 nm, and a thickness of the second barrier layer is in a range of 5 nm~20 nm.

9. The device according to claim 8, the thickness of the first barrier layer is in a range of 10 nm~20 nm, and a thickness of the second barrier layer is in a range of 5 nm~10 nm.

10. The device according to claim 1, a thickness of the light-emitting layer is in a range of 10 nm~50 nm.

11. The device according to claim 3, wherein, a thickness of the hole transporting layer is in a range of 10 nm~30 nm.

12. The device according to claim 3, wherein, a thickness of the electron transporting layer is in a range of 10 nm~30 nm.

13. A display device, comprising an organic light-emitting device as claimed in claim 1.

14. The display device according to claim 13, wherein,
the first electrode layer and the second electrode layer are respectively an anode layer and a cathode layer;
the light-emitting host material of the first barrier layer is a hole-type host material, the energy level of the highest occupied molecular orbit and the energy level of the lowest unoccupied molecular orbit are respectively 5.3~5.7 ev and 1.8~2.3 ev; and
the light-emitting host material of the second barrier layer is an ambipolar light-emitting host material, the energy level of the highest occupied molecular orbit and the energy level of the lowest unoccupied molecular orbit are respectively 5.5~6.0 ev and 2.5~3.5 ev.

15. The display device according to claim 14, wherein,
the organic light-emitting device further includes a hole transporting layer disposed between the first barrier layer and the anode layer, and an electron transporting layer disposed between the second barrier layer and the cathode layer;
a difference of energy level of highest occupied molecular orbit of the first barrier layer and the hole transporting layer is less than 0.2 ev, a difference of energy level of lowest unoccupied molecular orbit of the first barrier layer and the hole transporting layer is greater than 0.2 ev; and
a difference of energy level of lowest unoccupied molecular orbit of the second barrier layer and the electron transporting layer is less than 0.2 ev, a difference of energy level of highest occupied molecular orbit of the second barrier layer and the electron transporting layer is greater than 0.2 ev.

16. The display device according to claim 13, wherein, the chemical structural formula of the first light-emitting host material is:

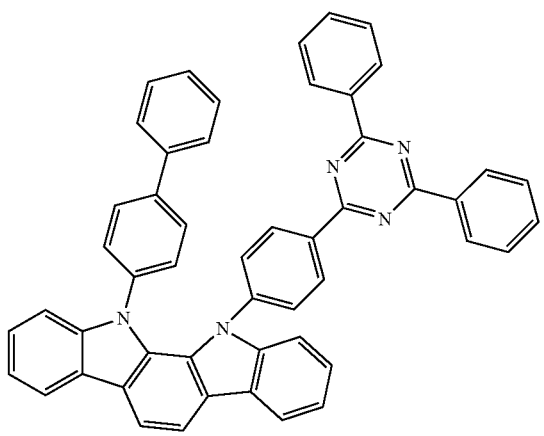

17. The display device according to claim 13, wherein, the chemical structural formula of the second light-emitting host material is:

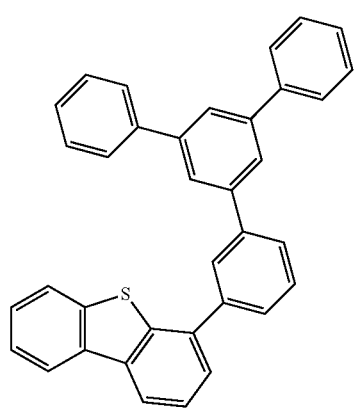

-continued
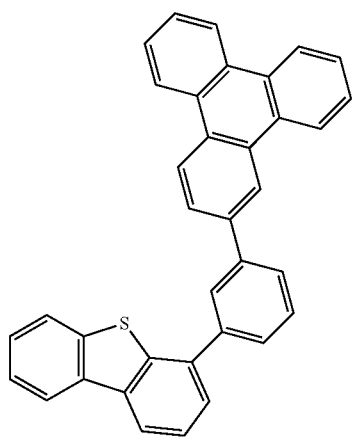
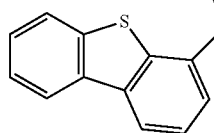
-continued
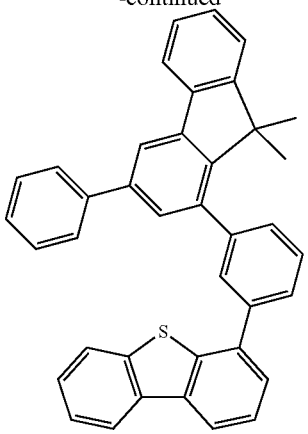
* * * * *